United States Patent
Li et al.

(10) Patent No.: US 10,290,352 B2
(45) Date of Patent: May 14, 2019

(54) SYSTEM, APPARATUS, AND METHOD OF PROGRAMMING A ONE-TIME PROGRAMMABLE MEMORY CIRCUIT HAVING DUAL PROGRAMMING REGIONS

(71) Applicant: QUALCOMM Incorporated, San Diego, CA (US)

(72) Inventors: Xia Li, San Diego, CA (US); Xiao Lu, San Diego, CA (US); Xiaonan Chen, San Diego, CA (US); Zhongze Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 336 days.

(21) Appl. No.: 14/633,793

(22) Filed: Feb. 27, 2015

(65) Prior Publication Data
US 2016/0254056 A1 Sep. 1, 2016

(51) Int. Cl.
*G11C 16/10* (2006.01)
*H01L 29/792* (2006.01)
*G11C 16/04* (2006.01)
*G11C 17/16* (2006.01)
*G11C 17/18* (2006.01)
*H01L 29/423* (2006.01)
*H01L 27/112* (2006.01)
*G11C 17/14* (2006.01)

(52) U.S. Cl.
CPC .......... *G11C 16/10* (2013.01); *G11C 16/0466* (2013.01); *G11C 17/146* (2013.01); *G11C 17/16* (2013.01); *G11C 17/18* (2013.01); *H01L 27/11206* (2013.01); *H01L 29/42348* (2013.01); *H01L 29/7923* (2013.01)

(58) Field of Classification Search
CPC ..... G11C 16/10; G11C 16/0466; G11C 17/18; G11C 17/16
See application file for complete search history.

(56) References Cited

U.S. PATENT DOCUMENTS 7,209,385 B1 4/2007 Wu et al.
8,188,533 B2 5/2012 Forbes
(Continued)

FOREIGN PATENT DOCUMENTS

GB 1247892 A 9/1971

OTHER PUBLICATIONS

Hsiao W.Y., et al., "A New 28 nm High-K Metal Gate CMOS Logic One-Time Programmable Memory Cell," Japanese Journal of Applied Physics, 2014, pp. 04ED01-1 to 04ED01-4.
(Continued)

*Primary Examiner* — Jerome Leboeuf
(74) *Attorney, Agent, or Firm* — Muncy, Geissler, Olds & Lowe, P.C./Qualcomm

(57) ABSTRACT

A semiconductor device for a one-time programmable (OTP) memory according to some examples of the disclosure includes a gate, a dielectric region below the gate, a source terminal below the dielectric region and offset to one side, a drain terminal below the dielectric region and offset to an opposite side from the source terminal, a drain side charge trap in the dielectric region capable of programming the semiconductor device, and a source side charge trap in the dielectric region opposite the drain side charge trap and capable of programming the semiconductor device.

23 Claims, 9 Drawing Sheets

(56) References Cited

U.S. PATENT DOCUMENTS

| | | |
|---|---|---|
| 8,320,192 B2 | 11/2012 | Akil et al. |
| 8,324,663 B2 | 12/2012 | Qiu et al. |
| 8,422,265 B2 | 4/2013 | Hui et al. |
| 2002/0027264 A1* | 3/2002 | Forbes ............... G11C 8/08 257/662 |
| 2002/0084484 A1* | 7/2002 | Kurihara ......... H01L 21/28282 257/315 |
| 2003/0142542 A1* | 7/2003 | Yang ............... G11C 16/0408 365/185.05 |
| 2006/0180847 A1 | 8/2006 | Park et al. |
| 2007/0117323 A1 | 5/2007 | Yeh et al. |
| 2007/0274126 A1* | 11/2007 | Kohler ................ G11C 17/14 365/184 |
| 2008/0019165 A1* | 1/2008 | Lin ..................... G11C 17/04 365/102 |
| 2008/0205141 A1 | 8/2008 | Lee et al. |
| 2008/0266977 A1 | 10/2008 | Wu |
| 2009/0180332 A1* | 7/2009 | Wu ................... G11C 16/0466 365/185.27 |
| 2009/0296491 A1 | 12/2009 | Hong et al. |
| 2010/0105178 A1* | 4/2010 | Kim ..................... B82Y 10/00 438/261 |
| 2010/0128536 A1 | 5/2010 | Akil et al. |
| 2011/0156157 A1 | 6/2011 | Milani et al. |
| 2013/0099853 A1 | 4/2013 | Yang et al. |
| 2014/0043899 A1 | 2/2014 | Chang et al. |
| 2014/0138777 A1 | 5/2014 | Wang |
| 2014/0209994 A1* | 7/2014 | Roizin ................ H01L 29/792 257/324 |
| 2014/0219015 A1* | 8/2014 | Li ....................... G11C 17/08 365/182 |
| 2014/0219016 A1 | 8/2014 | Li et al. |
| 2015/0318043 A1* | 11/2015 | Chishti ............ G11C 16/0466 365/185.21 |

OTHER PUBLICATIONS

International Search Report and Written Opinion—PCT/US16/017013—ISA/EPO—dated May 16, 2016.
International Search Report and Written Opinion—PCT/US2016/017013—ISA/EPO—dated Oct. 21, 2016.

* cited by examiner

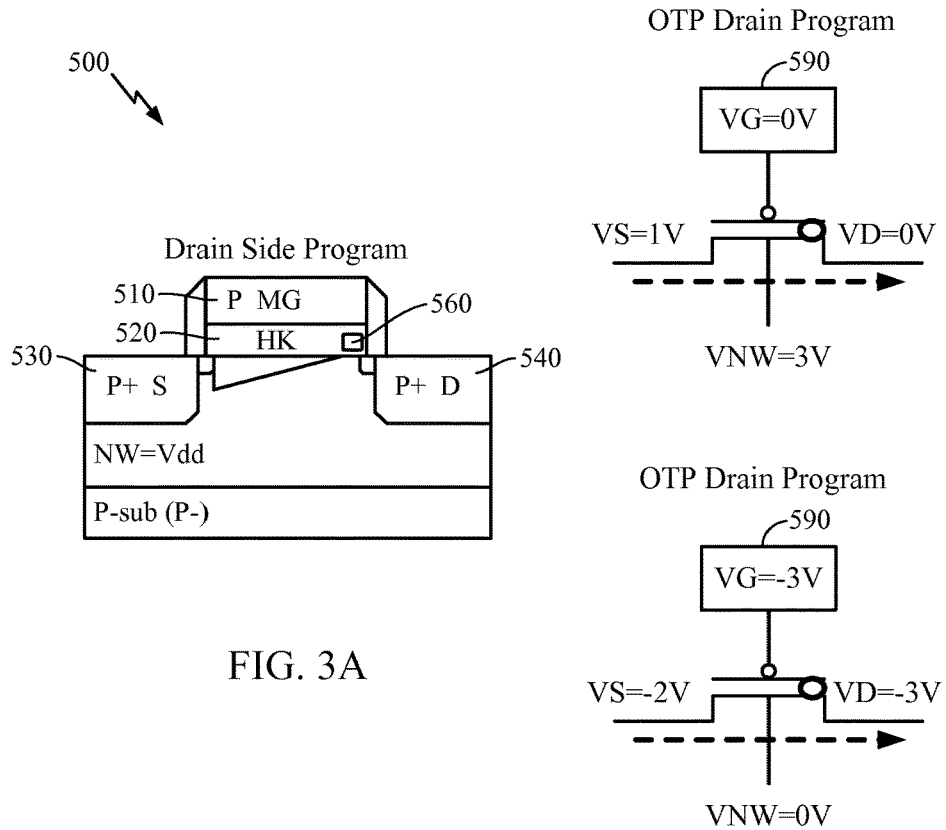
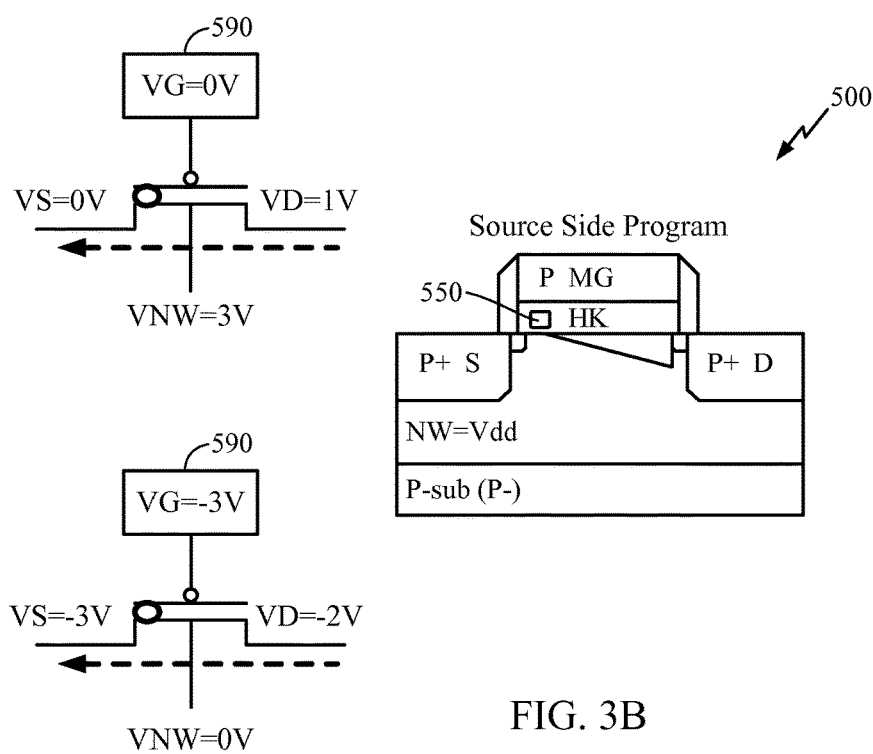
FIG. 3A
FIG. 3B

SYSTEM, APPARATUS, AND METHOD OF PROGRAMMING A ONE-TIME PROGRAMMABLE MEMORY CIRCUIT HAVING DUAL PROGRAMMING REGIONS

FIELD OF DISCLOSURE

This disclosure relates generally to integrated circuits, and more specifically, but not exclusively, one-time programmable memory circuits.

BACKGROUND

The scaling of complementary metal-oxide semiconductor (CMOS) technology leads to a greater difficulty in the integration of both floating gate memory and logic together for high performance and low power memory circuits. The floating gate memory provides one programmable memory (OTP) and embedded Flash memory. Embedded Flash memory is typically 2 or 3 nodes behind leading edge CMOS technology, because of the complexity of integrating additional processing (which also increases the costs). As a result, one-time programmable (OTP) memory is being used increasingly for embedded non-volatile memory (NVM) applications.

Two types of OTP memory are currently available on CMOS technology at or below 65 nm: electrical fuse (eFuse) and anti-fuse. An eFuse memory element is programmed by forcing a high current density through a conductive link in order to completely rupture it or make its resistance significantly higher such that the link is no longer conductive (the link is high resistance or open circuit). Anti-fuse is the opposite of an eFuse. The circuit is originally open (high resistance) and is programmed by applying electrical stress that creates a low resistance conductive path.

eFuse programming, however, requires high current, it is programmed during production of the device and programming during the operation of the chip on which it resides. The use of charge trapping in metal-oxide semiconductor (MOS) transistors, and in particular using channel hot charge (CHC) injection for programming, has been developed. However, programming typically requires high power and has low programming efficiency. For example, logic high K/metal gate (HK/MG) OTP devices are programmed by MOS device operation. It may generate charge trap closing in a drain side of gate dielectric when device is programmed due to CHC injection. However, to reduce power and energy, a weak program condition may be applied. The weak program condition has less Vt shift and without gate breakdown, a small program window, and weak data retention performance.

Accordingly, there is a need for systems, apparatus, and methods that improve upon conventional approaches including the improved methods, system and apparatus provided hereby.

The inventive features that are characteristic of the teachings, together with further features and advantages, are better understood from the detailed description and the accompanying figures. Each of the figures is provided for the purpose of illustration and description only, and does not limit the present teachings.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

Some examples of the disclosure are directed to systems, apparatus, and methods including a semiconductor device for a one-time programmable (OTP) memory having a gate, a dielectric region vertically below the gate, a source terminal vertically below the gate and the dielectric region and horizontally offset to a first side, a drain terminal vertically below the gate and the dielectric region and horizontally offset to a second side opposite the first side, a drain side Vt program region in the dielectric region, the drain side Vt program region being capable of programming the semiconductor device, and a source side Vt program region in the dielectric region horizontally opposite the drain side Vt program region, the source side Vt program region being capable of programming the semiconductor device.

Some examples of the disclosure are directed to systems, apparatus, and methods including a system for programming a one-time programmable memory cell having a gate, a program circuit coupled to the gate, the program circuit configured to apply a program voltage to the gate, a dielectric region vertically below the gate, a source terminal vertically below the gate and the dielectric region and horizontally offset to a first side, a drain terminal vertically below the gate and the dielectric region and horizontally offset to a second side opposite the first side, a drain side Vt program region in the dielectric region, the drain side Vt program region being capable of programming the semiconductor device in conjunction with the program voltage, and a source side Vt program region in the dielectric region horizontally opposite the drain side Vt program region, the source side Vt program region being capable of programming the semiconductor device in conjunction with the program voltage.

In some examples of the disclosure, the system, apparatus, and method for programming an OTP memory include applying a gate to source voltage of approximately −3 volts to a programmable gate device, applying a first program voltage of approximately −1.4 volts to a drain side Vt program region of the programmable gate device, and applying a second program voltage of approximately −1.4 volts to a source side Vt program region of the programmable gate device.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which:

FIGS. 3A and 3B illustrate source and drain programming for a semiconductor device with dual program regions in accordance with some examples of the disclosure.

Figure 1:
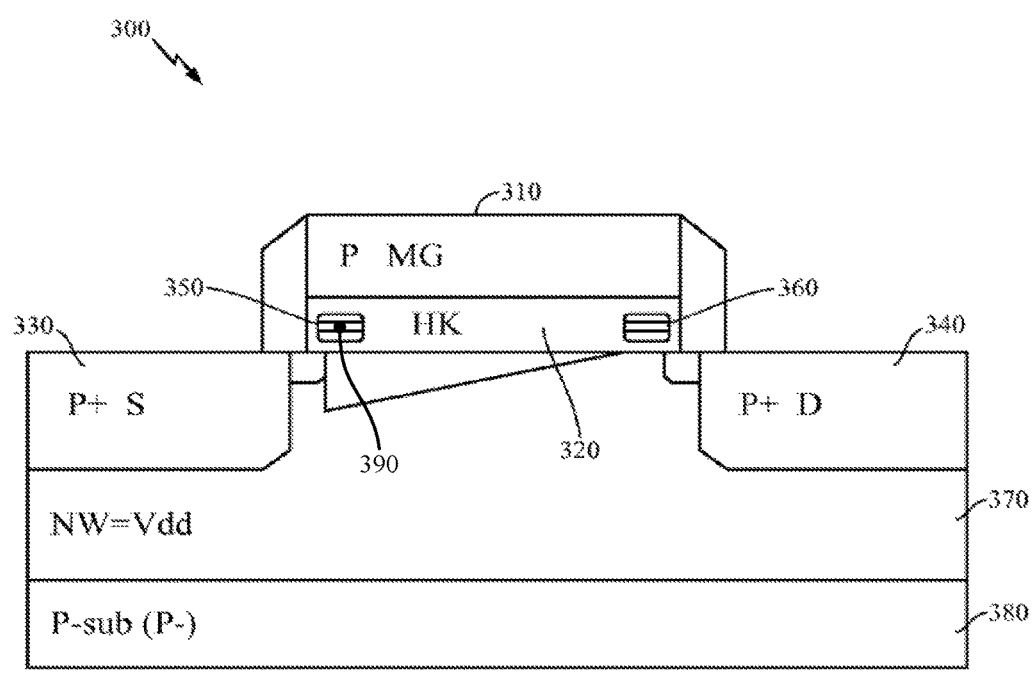
FIG. 1 illustrates a semiconductor device with dual program regions in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein advantageously address drawbacks or disadvantages of conventional approaches, as well as other previously unidentified needs, and mitigate shortcomings of the conventional methods, apparatus, and systems. For example, by utilizing dual programming at a source and drain to increase Vt shift at the source and drain location, a program window is increased and data retention performance for a weak program condition is improved. One example of a system for programming an OTP memory cell includes a PMOS or NMOS device with a source side Vt program region and a drain side Vt program region in a dielectric region below a gate coupled to a program circuit. The program circuit may apply a program voltage that turns the program regions into charges traps for programming both the source side and the drain side such that the gate threshold voltage is raised by approximately 300 millivolts. In addition, the asymmetrical response of the drain and source currents can be reduce—brought closer to a symmetrical response by dual programming versus single programming.

Various aspects are disclosed in the following description and related drawings to show specific examples relating to the disclosure. Alternate examples will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and examples disclosed herein.

The word "exemplary" is used herein to mean "serving as an example, instance, or illustration." Any details described herein as "exemplary" is not necessarily to be construed as preferred or advantageous over other examples. Likewise, the term "examples" does not require that all examples include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples only and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

Further, many examples are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the examples described herein, the corresponding form of any such examples may be described herein as, for example, "logic configured to" perform the described action.

In this description, certain terminology is used to describe certain features. The term "mobile device" can describe, and is not limited to, a mobile phone, a mobile communication device, a pager, a personal digital assistant, a personal information manager, a mobile hand-held computer, a laptop computer, a wireless device, a wireless modem, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

FIG. 1 illustrates a semiconductor device with dual program regions in accordance with some examples of the disclosure. As shown in FIG. 1, a semiconductor device for a OTP memory 300 may include a gate 310, a dielectric region 320 vertically below the gate 310, a source terminal 330 vertically below the gate 310 and the dielectric region 320 but horizontally offset to one side, a drain terminal 340 vertically below the gate 310 and the dielectric region 320 and horizontally offset to the opposite side from the source terminal 330. The gate 310 may be of different types, such as a p-type gate, n-type gate, or polygate. The gate 310 may be composed of different materials, such as metal or metal alloys. The dielectric region 320 may be composed of dielectric material preferably high K dielectric material, such as hafnium oxide.

The semiconductor device 300 may include a source side Vt program region 350 in the dielectric region 320 offset towards the source terminal 330 and a drain side Vt program region 360 in the dielectric region 320 offset towards the drain terminal 340 horizontally opposite the source side Vt program region 350. The source side Vt program region 350 and drain side Vt program region 360 are composed material capable of programming the semiconductor device 300, such as a charge trap composed of layers of materials. These materials may be a silicon oxide film and high-k oxide, such as HfO2. A trap 390 is illustrated as having formed in the source side Vt program region 350.

The semiconductor device 300 may include a first well layer 370 the extends horizontally below the source terminal 330 and the drain terminal 340 and extends vertically upward between the source terminal 330 and the drain terminal 340, and a second well layer 380 below the first well layer. The well layers are shown as n and p wells for a PMOS semiconductor device 300, but it should be understood that the well layers may be p and n wells (reversed) for a NMOS semiconductor device.

Figure 2A:
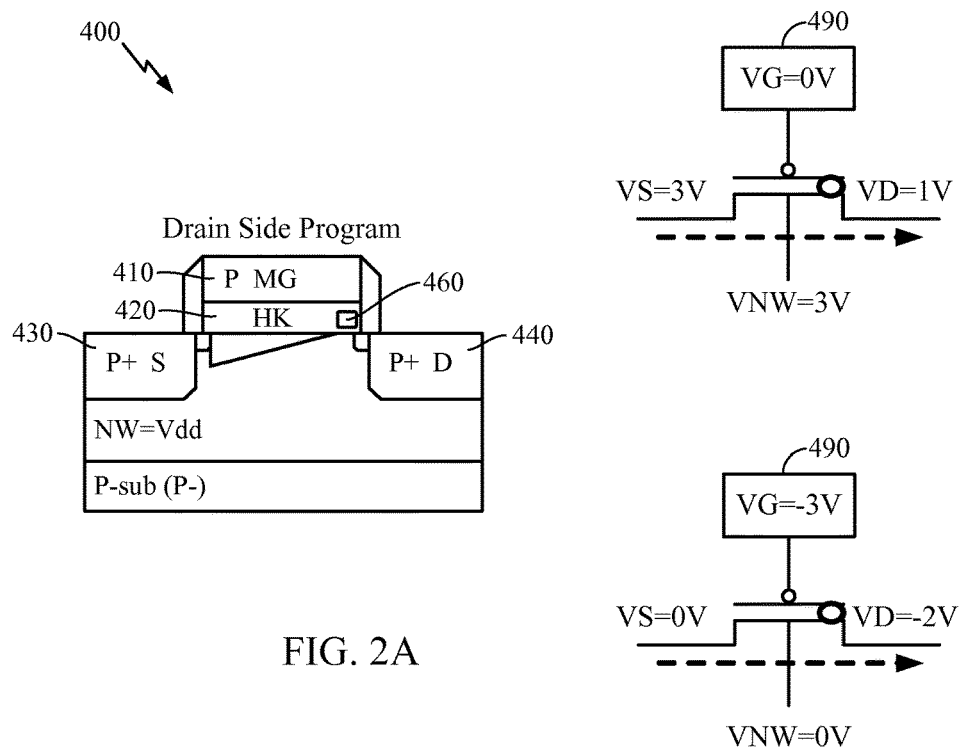
FIGS. 2A and 2B illustrate source and drain programming for a semiconductor device with dual program regions in accordance with some examples of the disclosure.
Figure 2B:
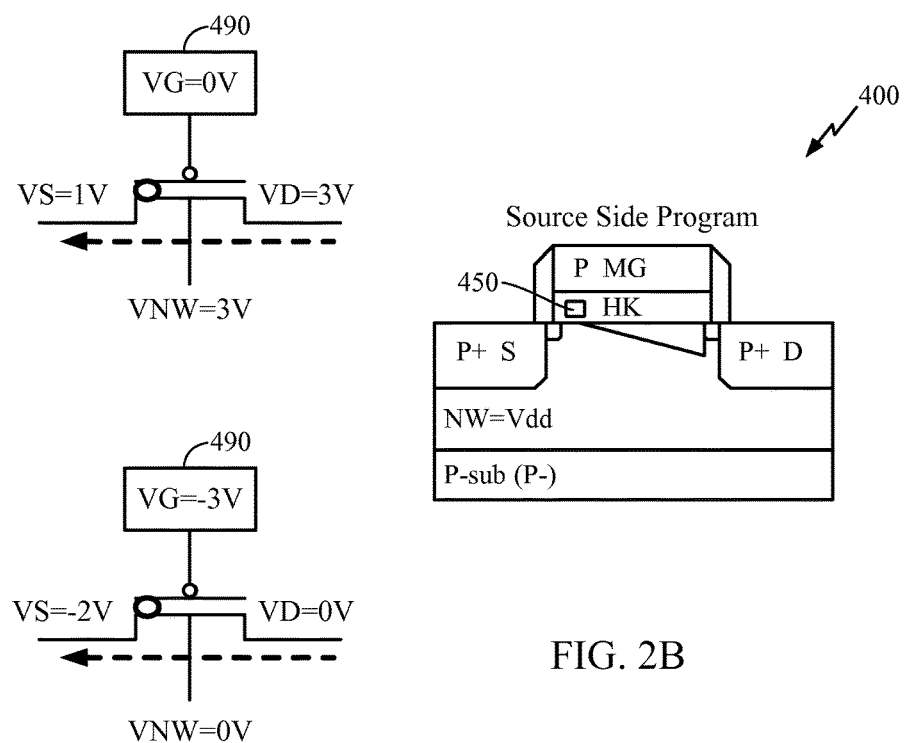

FIGS. 2A and 2B illustrate source and drain programming for a semiconductor device with dual program regions in accordance with some examples of the disclosure. As shown in FIGS. 2A and 2B, a semiconductor device 400 may include a gate 410, a dielectric region 420 vertically below the gate 410, a source terminal 430 vertically below the gate 410 and the dielectric region 420 but horizontally offset to one side, a drain terminal 440 vertically below the gate 410 and the dielectric region 420 and horizontally offset to the opposite side from the source terminal 430, a source side Vt program region 450 (shown in FIG. 2B) in the dielectric region 420 offset towards the source terminal 430, a drain side Vt program region 460 (shown in FIG. 2A) in the dielectric region 420 offset towards the drain terminal 440 horizontally opposite the source side Vt program region 450, and a programming circuit 490 coupled to the gate 410. The programming circuit 490 is capable of selectively applying a programming voltage to the semiconductor device 400. When the programming circuit 490 applies a programming voltage to the semiconductor device 400, microscopic defects, or traps, are generated in the Vt program region (450 or 460 depending on which side is being programmed) during electric field stress created by the programming voltage (CHC injection). These defects lead to increased leakages across the gate and the trapped charges begin to form conduction paths or channels through the Vt program region. The conductive channels may be scaled down to below 10 nm channel lengths such as 5 or 7 nm channel lengths.

FIG. 2A shows the effect of the programming circuit 490 either a programming voltage is applied to the drain side Vt program region 460 (Vg=0 volts and Vnw=3V) or a programming voltage is applied (Vg=−3 volts and Vnw=0V). FIG. 2B shows the effect of the programming circuit 490 either a programming voltage is applied to the source side Vt program region 450 (Vg=0 volts and Vnw=3V) or a programming voltage is applied (Vg=−3 volts and Vnw=0V). As can be seen in Table 1 and Table 2 (after a relative NW bias is applied to transform PMOS terminal voltage) below, selective programming voltages produce different NW voltages during read and program operations.

TABLE 1

| Operations | Gate Vg | Source Vs | Drain Vd | NW Vnw |
| --- | --- | --- | --- | --- |
| Drain Read | 0 V | 1 V | 0 V | 1 V |
| Source Read | 0 V | 0 V | 1 V | 1 V |
| Drain Program | 0 V | 3 V | 1 V | 3 V |
| Source Program | 0 V | 1 V | 3 V | 3 V |

TABLE 2

| Operations | Gate Vgs | Source Vs | Drain Vds | NW Vbb |
| --- | --- | --- | --- | --- |
| Drain Read | −1 V | 0 V | −1 V | 0 V |
| Source Read | −1 V | −1 V | 0 V | 0 V |
| Drain Program | −3 V | 0 V | −2 V | 0 V |
| Source Program | −3 V | −2 V | 0 V | 0 V |

FIGS. 3A and 3B illustrate an alternative source and drain programming for a semiconductor device with dual program regions in accordance with some examples of the disclosure similar to FIGS. 2A and 2B. As shown in FIGS. 3A and 3B, a semiconductor device 500 may include a gate 510, a dielectric region 520 vertically below the gate 510, a source terminal 530 vertically below the gate 510 and the dielectric region 520 but horizontally offset to one side, a drain terminal 540 vertically below the gate 510 and the dielectric region 520 and horizontally offset to the opposite side from the source terminal 530, a source side Vt program region 550 (shown in FIG. 3B) in the dielectric region 520 offset towards the source terminal 530, a drain side Vt program region 560 (shown in FIG. 3A) in the dielectric region 520 offset towards the drain terminal 540 horizontally opposite the source side Vt program region 550, and a programming circuit 590 coupled to the gate 510. The programming circuit 590 is capable of selectively applying a programming voltage to the semiconductor device 500. When the programming circuit 590 applies a programming voltage to the semiconductor device 500, microscopic defects, or traps, are generated in the Vt program region (550 or 560 depending on which side is being programmed) during electric field stress created by the programming voltage (CHC injection). These defects lead to increased leakages across the gate and the trapped charges begin to form conduction paths through the Vt program region.

FIG. 3A shows the effect of the programming circuit 590 either a programming voltage is applied to the drain side Vt program region 560 (Vg=0 volts Vnw=3V) or a programming voltage is applied (Vg=−3 volts Vnw=0V). FIG. 3B shows the effect of the programming circuit 590 either a programming voltage is applied to the source side Vt program region 550 (Vg=0 volts Vnw=3V) or a programming voltage is applied (Vg=−3 volts Vnw=0V). As can be seen in Table 3 and Table 4 (after a relative NW bias is applied to transform PMOS terminal voltage) below, selective programming voltages produce different NW voltages during read and program operations.

TABLE 3

| Operations | Gate Vg | Source Vs | Drain Vd | NW Vnw |
|---|---|---|---|---|
| Drain Read | 0 V | 1 V | 0 V | 1 V |
| Source Read | 0 V | 0 V | 1 V | 1 V |
| Drain Program | 0 V | 1 V | 0 V | 3 V |
| Source Program | 0 V | 0 V | 1 V | 3 V |

TABLE 4

| Operations | Gate Vgs | Source Vs | Drain Vds | NW Vbb |
|---|---|---|---|---|
| Drain Read | −1 V | 0 V | −1 V | 0 V |
| Source Read | −1 V | −1 V | 0 V | 0 V |
| Drain Program | −3 V | −2 V | −3 V | 0 V |
| Source Program | −3 V | −3 V | −2 V | 0 V |

Figure 4:
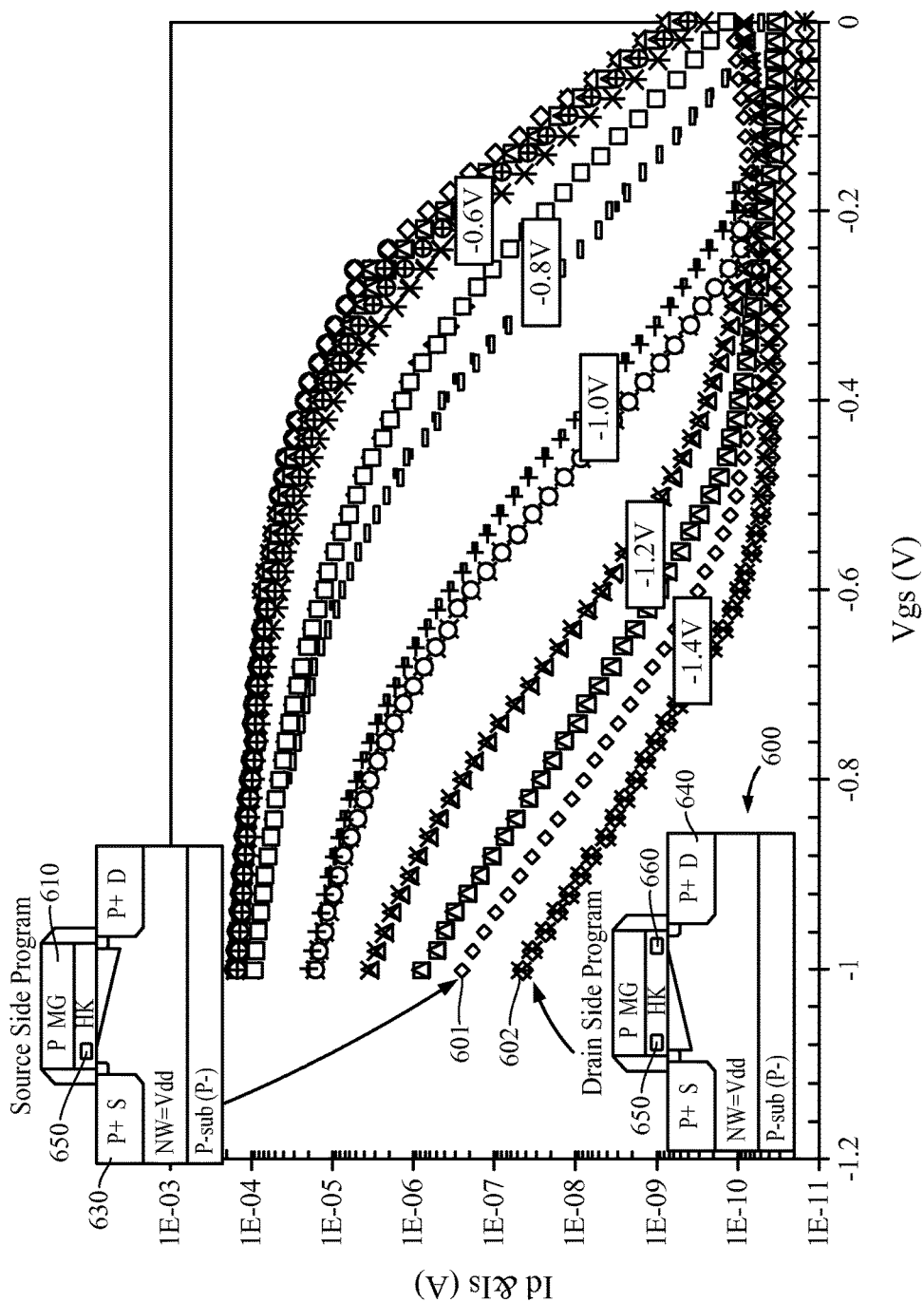
FIG. 4 illustrates source and drain currents and gate to source voltages after programming for a semiconductor device with dual program regions in accordance with some examples of the disclosure.

FIG. 4 illustrates source and drain currents and gate to source voltages after programming for a semiconductor device with dual program regions in accordance with some examples of the disclosure. As shown in FIG. 4, a semiconductor device 600 may include a source side Vt program region 650 and a drain side Vt program region 660. When the source side Vt program region 650 is programmed by creating a charge trap, the source terminal 630 current Is (A) versus the gate 610 voltage Vgs (V) response is shown in graph 601. When the drain side Vt program region 660 is programmed by create a charge trap, the drain terminal 640 current Id (A) versus the gate 610 voltage Vgs (V) response is shown in graph 602. For example, when a program circuit (not shown) applies a drain side program voltage of Vgs=0∼−3V, this produces a response of Vd=0, Vs=−0.6∼−1.4V, and Vsb=0V. Thus, Vt is increased in drain side. When a program circuit (not shown) applies a source side program voltage of Vgs=0∼−3V, this produces a response of Vd=−0.6∼−1.4V, Vs=0, Vsb=0V. Thus, Vt is increased in source side. When the drain side is read with Vgs=0∼−1, we see Vd=0, Vs=−1, and Vsb=0. Thus, the drain side Vt has more impact. By increasing a program voltage from −0.6V∼−1.4V for a fixed Vgs=−3V, the program window is improved.

Figure 5:
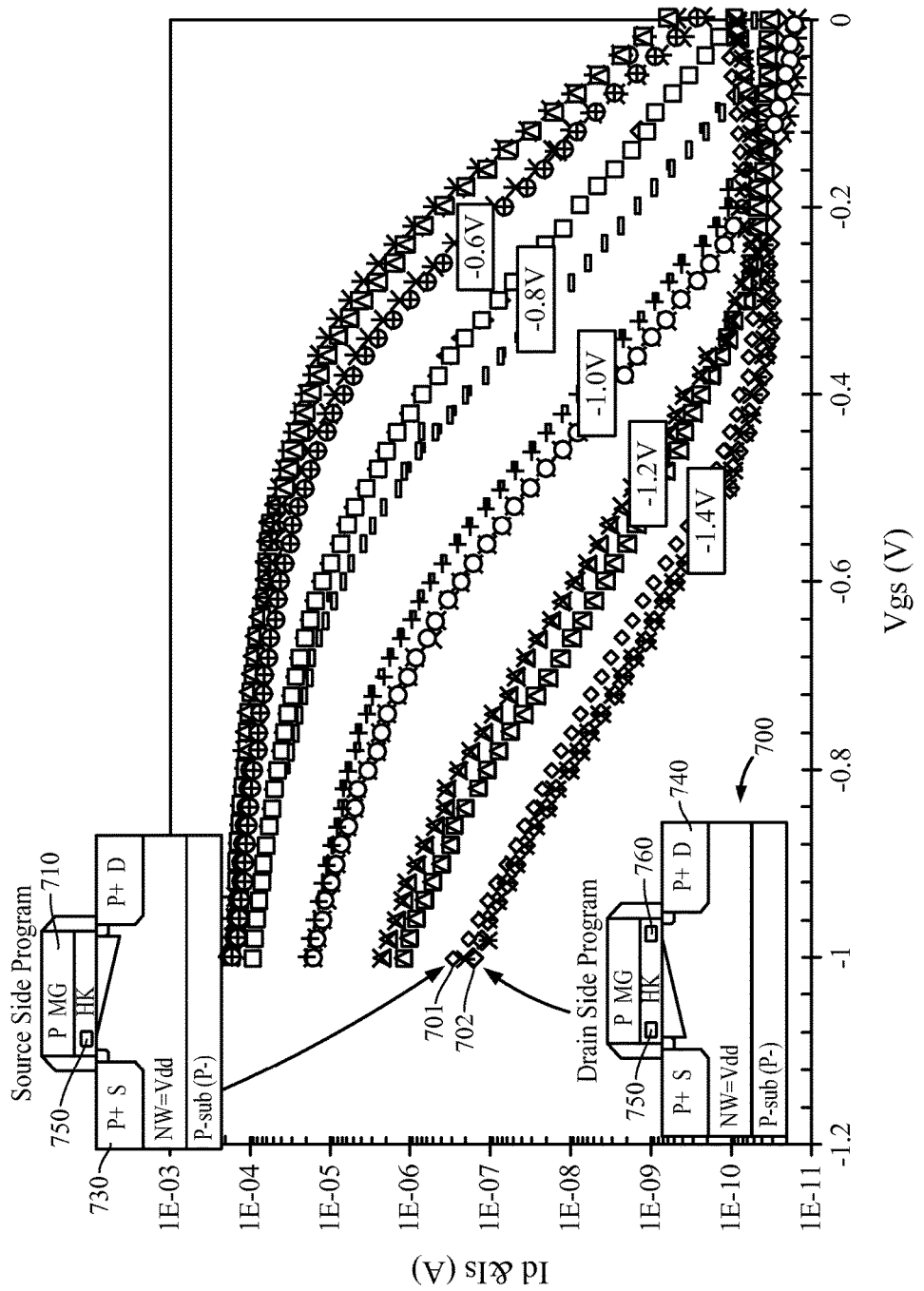
FIG. 5 illustrates source and drain currents and gate to source voltages after programming for a semiconductor device with dual program regions in accordance with some examples of the disclosure.

FIG. 5 illustrates alternative source and drain currents and gate to source voltages after programming for a semiconductor device with dual program regions in accordance with some examples of the disclosure. As shown in FIG. 5, a semiconductor device 700 may include a source side Vt program region 750 and a drain side Vt program region 760. When the source side Vt program region 750 is programmed by creating a charge trap, the source terminal 730 current Is (A) versus the gate 710 voltage Vgs (V) response is shown in graph 701. When the drain side Vt program region 760 is programmed by create a charge trap, the drain terminal 740 current Id (A) versus the gate 710 voltage Vgs (V) response is shown in graph 702. For example, when a program circuit (not shown) applies a drain side program voltage of Vgs=0∼−3V, this produces a response of Vd=0, Vs=−0.6∼−1.4V, and Vsb=0V. Thus, Vt is increased in drain side. When a program circuit (not shown) applies a source side program voltage of Vgs=0∼−3V, this produces a response of Vd=−0.6∼−1.4V, Vs=0, Vsb=0V. Thus, Vt is increased in source side. When the source side is read with Vgs=0∼−1, we see Vd=1, Vs=0, and Vsb=0. Thus, the source side Vt has more impact. By increasing a program voltage from −0.6V∼−1.4V for a fixed Vgs=−3V, the program window is improved.

Figure 6:
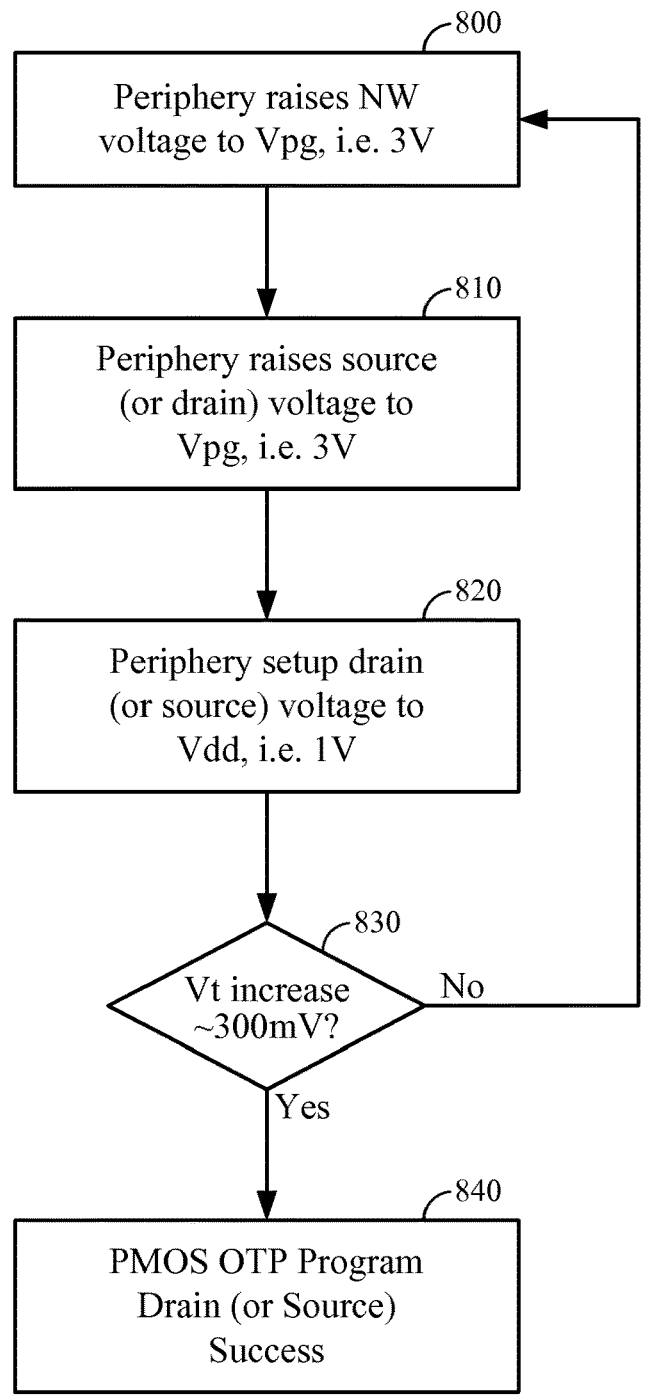
FIG. 6 illustrates a partial process flow chart for programming a semiconductor device with dual program regions in accordance with some examples of the disclosure.

FIG. 6 illustrates a partial process flow chart for programming a semiconductor device with dual program regions in accordance with some examples of the disclosure. As shown in FIG. 6, the partial process flow begins in step 800 when a program circuit (periphery) raises the n well (NW) voltage to a gate program voltage (Vpg) of, for example, 3 volts. The process continues in step 810 when the program circuit raises the source (or drain) voltage to Vpg (for example, 3 volts). The process then continues in step 820 when the program circuit applies a setup drain (or source) voltage to Vdd of, for example, 1 volt. In step 830, a determination is made of whether the threshold voltage (Vt) is increased approximately 300 mV. If no, the process returns to step 800. If yes, the process proceeds to step 840 and the OTP programming of the drain (or source) is a success.

Figure 7:
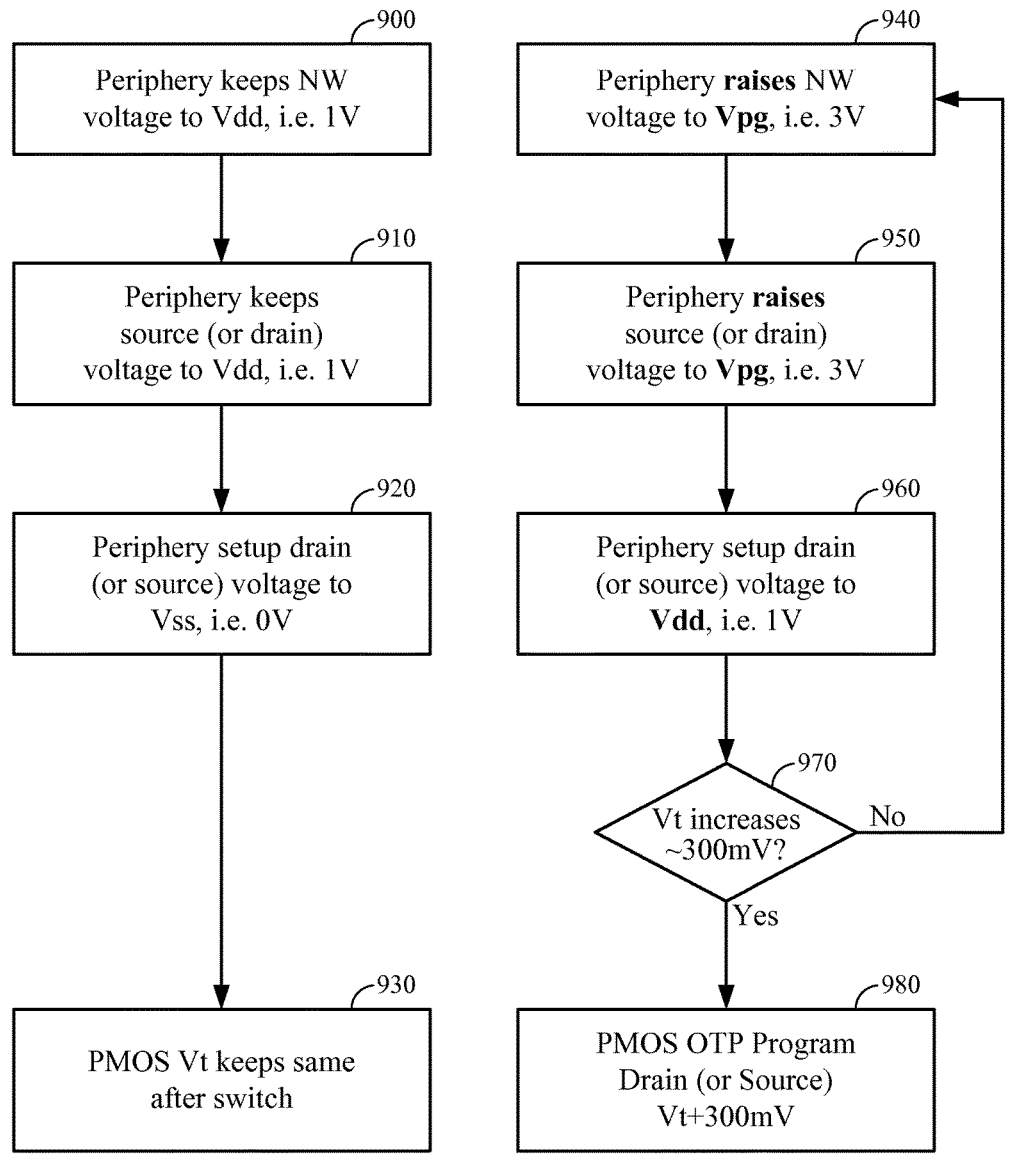
FIG. 7 illustrates partial process flow charts for two programming flows of a semiconductor device with dual program regions in accordance with some examples of the disclosure.

FIG. 7 illustrates partial process flow charts for two programming flows of a semiconductor device with dual program regions in accordance with some examples of the disclosure. As shown in FIG. 7, the first partial process flow begins in step 900 for a normal PMOS switch mode when a program circuit (periphery) keeps the NW voltage at Vdd (for example, 1 volt). The process continues in step 910 when the program circuit keeps the source (or drain) voltage at Vdd of, for example, 1 volt. The process then continues in step 920 when the program circuit applies a setup drain (or source) voltage at Vss of, for example, 0 volts. The partial process concludes in step 940 when the Vt stays the same after the Vt starts switching.

As shown in FIG. 7, the second partial process flow begins in step 940 for an OTP programming mode when a program circuit (periphery) raises the n well (NW) voltage to a gate program voltage (Vpg) of, for example, 3 volts. The process continues in step 950 when the program circuit raises the source (or drain) voltage to Vpg (for example, 3 volts). The process then continues in step 960 when the program circuit applies a setup drain (or source) voltage to Vdd of, for example, 1 volt. In step 970, a determination is made of whether the threshold voltage (Vt) is increased approximately 300 mV. If no, the process returns to step 940. If yes, the process proceeds to step 980 and the OTP programming of the drain (or source) is a success.

Figure 8:
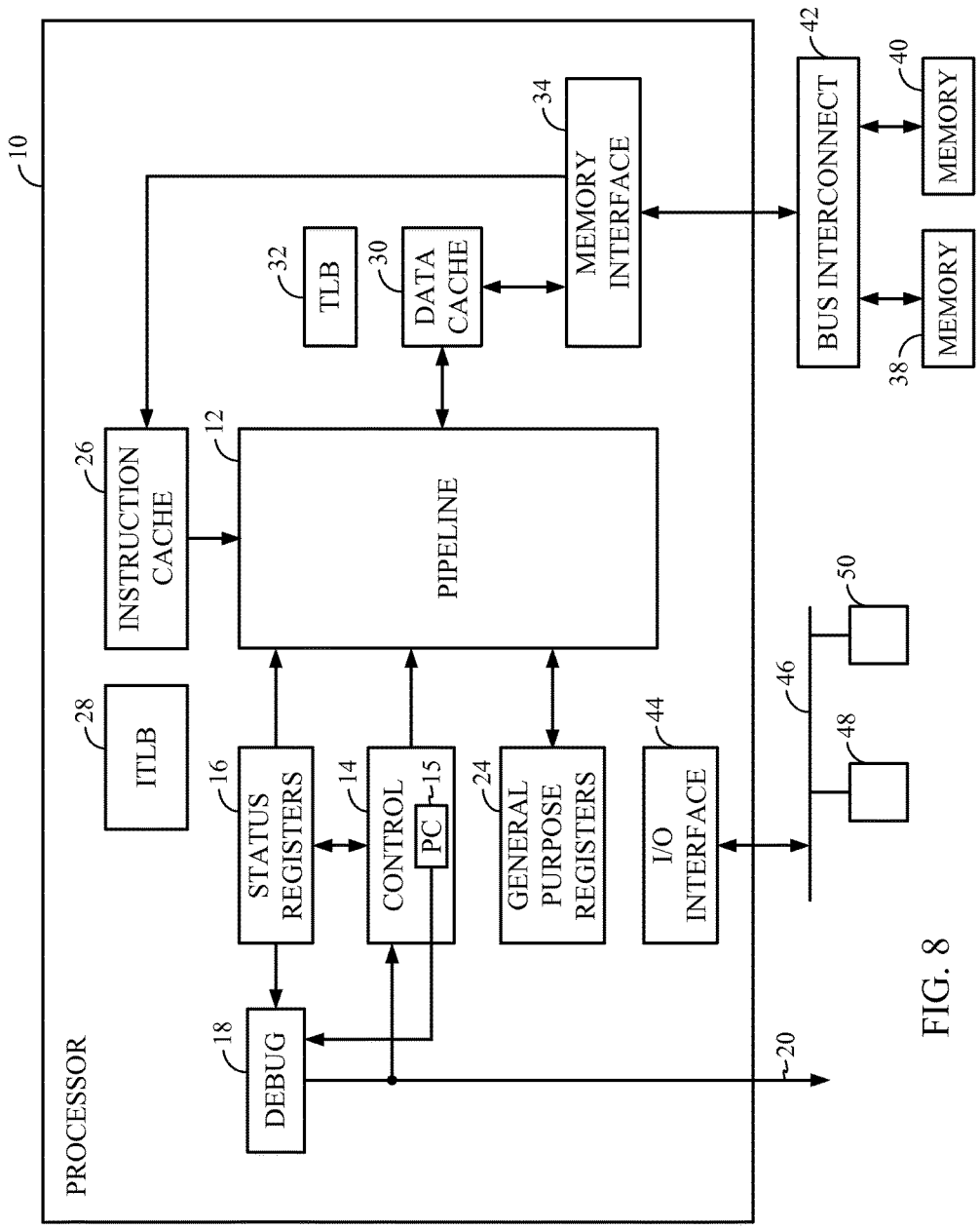
FIG. 8 illustrates an exemplary processor in accordance with some examples of the disclosure.

FIG. 8 depicts a functional block diagram of an exemplary processor 10, such as an ASIC 208 (see below). Processor 10 executes instructions in an instruction execution pipeline 12 according to control logic 14. Control logic 14 maintains a Program Counter (PC) 15, and sets and clears bits in one or more status registers 16 to indicate, e.g., the current instruction set operating mode, information regarding the results of arithmetic operations and logical comparisons (zero, carry, equal, not equal), and the like. In some examples, pipeline 12 may be a superscalar design, with multiple, parallel pipelines. Pipeline 12 may also be referred to as an execution unit. A General Purpose Register (GPR) file 20 provides a list of general purpose registers 24 accessible by pipeline 12, and comprising the top of the memory hierarchy.

Processor 10, which executes instructions from at least two instruction sets in different instruction set operating modes, additionally includes a debug circuit 18, operative to compare, upon the execution of each instruction, at least a predetermined target instruction set operating mode to the current instruction set operating mode, and to provide an indication of a match between the two.

Pipeline 12 fetches instructions from an instruction cache (I-cache) 26, with memory address translation and permissions managed by an Instruction-side Translation Lookaside Buffer (ITLB) 28. Data is accessed from a data cache (D-cache) 30, with memory address translation and permissions managed by a main Translation Lookaside Buffer (TLB) 32. In various examples, ITLB 28 may comprise a copy of part of TLB 32. Alternatively, ITLB 28 and TLB 32 may be integrated. Similarly, in various examples of processor 10, I-cache 26 and D-cache 30 may be integrated, or unified. Further, I-cache 26 and D-cache 30 may be L1 caches. Misses in I-cache 26 and/or D-cache 30 cause an access to main (off-chip) memory 38, 40 by a memory interface 34. Memory interface 34 may be a master input to a bus interconnect 42 implementing a shared bus to one or more memory devices 38, 40 that may incorporate the improved data decompression in accordance with some examples of the disclosure. Additional master devices (not shown) may additionally connect to bus interconnect 42.

Processor 10 may include input/output (I/O) interface 44, which may be a master device on a peripheral bus, across which I/O interface 44 may access various peripheral devices 48, 50 via bus 46. Those of skill in the art will recognize that numerous variations of processor 10 are possible. For example, processor 10 may include a second-level (L2) cache for either or both I and D caches 26, 30. In addition, one or more of the functional blocks depicted in processor 10 may be omitted from a particular example. Other functional blocks that may reside in processor 10, such as a JTAG controller, instruction pre-decoder, branch target address cache, and the like are not germane to a description of the present disclosure, and are omitted for clarity.

Figure 9:
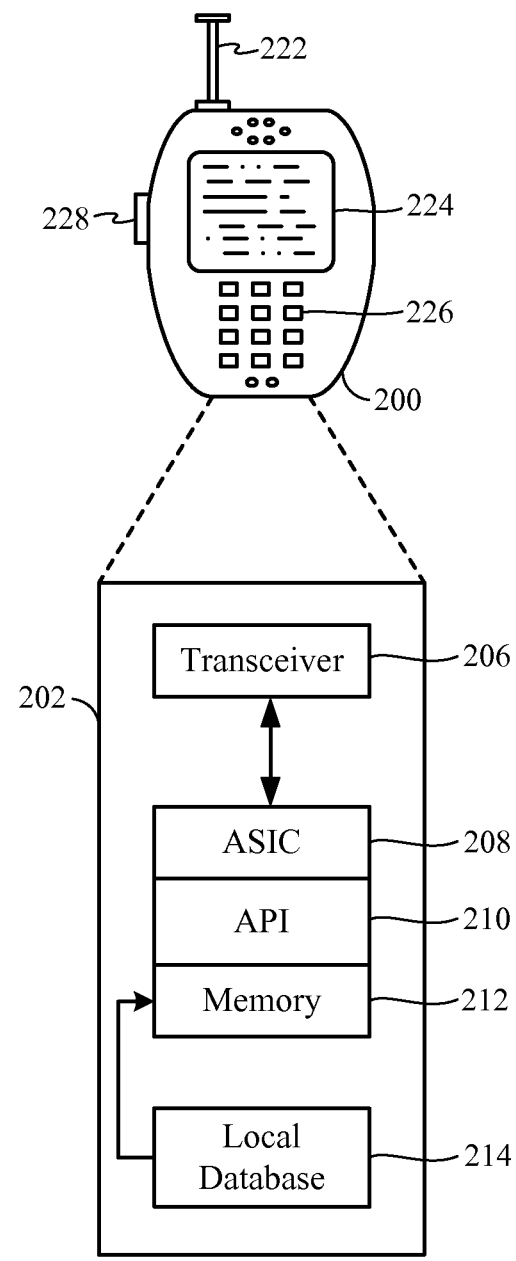
FIG. 9 illustrates exemplary user equipment (UE) in accordance with some examples of the disclosure.

Referring to FIG. 9, a system 100 that includes a UE 200, (here a wireless device), such as a cellular telephone, which has a platform 202 that can receive and execute software applications, data and/or commands transmitted from a radio access network (RAN) that may ultimately come from a core network, the Internet and/or other remote servers and networks. Platform 202 can include transceiver 206 operably coupled to an application specific integrated circuit ("ASIC" 208), or other processor, microprocessor, logic circuit, or other data processing device. ASIC 208 or other processor executes the application programming interface ("API") 210 layer that interfaces with any resident programs in memory 212 of the wireless device. Memory 212 can be comprised of read-only or random-access memory (RAM and ROM), EEPROM, flash cards, or any memory common to computer platforms. Platform 202 also can include local database 214 that can hold applications not actively used in memory 212. Local database 214 is typically a flash memory cell, but can be any secondary storage device as known in the art, such as magnetic media, EEPROM, optical media, tape, soft or hard disk, or the like. Internal platform 202 components can also be operably coupled to external devices such as antenna 222, display 224, push-to-talk button 228 and keypad 226 among other components, as is known in the art.

Accordingly, an example of the disclosure can include a UE including the ability to perform the functions described herein. As will be appreciated by those skilled in the art, the various logic elements can be embodied in discrete elements, software modules executed on a processor or any combination of software and hardware to achieve the functionality disclosed herein. For example, ASIC 208, memory 212, API 210 and local database 214 may all be used cooperatively to load, store and execute the various functions disclosed herein and thus the logic to perform these functions may be distributed over various elements. Alternatively, the functionality could be incorporated into one discrete component. Therefore, the features of UE 200 in FIG. 9 are to be considered merely illustrative and the disclosure is not limited to the illustrated features or arrangement.

The wireless communication between UE 200 and the RAN can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE) or other protocols that may be used in a wireless communications network or a data communications network.

Nothing stated or illustrated depicted in this application is intended to dedicate any component, step, feature, benefit, advantage, or equivalent to the public, regardless of whether the component, step, feature, benefit, advantage, or the equivalent is recited in the claims.

Those of skill in the art will appreciate that the various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method step or as a feature of a method step. Analogously thereto, aspects described in connection with or as a method step also constitute a description of a corresponding block or detail or feature of a corresponding device. Some or all of the method steps can be performed by a hardware apparatus (or using a hardware apparatus), such as, for example, a microprocessor, a programmable computer or an electronic circuit. In some examples, some or a plurality of the most important method steps can be performed by such an apparatus.

The examples described above merely constitute an illustration of the principles of the present disclosure. It goes without saying that modifications and variations of the arrangements and details described herein will become apparent to other persons skilled in the art. Therefore, it is intended that the disclosure be restricted only by the scope of protection of the appended patent claims, rather than by the specific details presented on the basis of the description and the explanation of the examples herein.

In the detailed description above it can be seen that different features are grouped together in examples. This manner of disclosure should not be understood as an intention that the claimed examples require more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective steps or actions of this method.

Furthermore, in some examples, an individual step/action can be subdivided into a plurality of sub-steps or contain a plurality of sub-steps. Such sub-steps can be contained in the disclosure of the individual step and be part of the disclosure of the individual step.

While the foregoing disclosure shows illustrative examples of the disclosure, it should be noted that various changes and modifications could be made herein without departing from the scope of the disclosure as defined by the appended claims. The functions, steps and/or actions of the method claims in accordance with the examples of the disclosure described herein need not be performed in any particular order. Furthermore, although elements of the disclosure may be described or claimed in the singular, the plural is contemplated unless limitation to the singular is explicitly stated.

What is claimed is:

1. A semiconductor device for a one-time programmable (OTP) memory, comprising:
    a gate;
    a dielectric region vertically below the gate;
    a source terminal vertically below the gate and the dielectric region and horizontally offset to a first side;
    a drain terminal vertically below the gate and the dielectric region and horizontally offset to a second side opposite the first side;
    a drain side Vt program region surrounded by the dielectric region, the drain side Vt program region composed of layers of material, wherein traps are generated in the layers of material during programming of the semiconductor device; and
    a source side Vt program region surrounded by the dielectric region horizontally opposite the drain side Vt program region, the source side Vt program region composed of layers of material, wherein traps are generated in the layers of material during programming of the semiconductor device.

2. The semiconductor device of claim 1, wherein the gate is a p-type.

3. The semiconductor device of claim 1, wherein the gate is an n-type.

4. The semiconductor device of claim 1, wherein the gate is a metal gate.

5. The semiconductor device of claim 1, wherein the gate is a polygate.

6. The semiconductor device of claim 1, wherein the drain side Vt program region provides a first conductive path between the gate and the drain terminal.

7. The semiconductor device of claim 6, wherein the source side Vt program region provides a second conductive path between the gate and the source terminal.

8. The semiconductor device of claim 1, wherein the drain side Vt program region is a charge trap.

9. The semiconductor device of claim 1, wherein the source side Vt program region is a charge trap.

10. The semiconductor device of claim 1, wherein the drain side Vt program region and the source side Vt program region are dual program regions of the semiconductor device, and wherein both the drain side Vt program region and the source side Vt program region are programmed.

11. The semiconductor device of claim 1, further comprising a program circuit coupled to the gate, wherein the program circuit is configured to selectively apply a program voltage to the gate.

12. The semiconductor device of claim 1, wherein the semiconductor device is integrated into one of a mobile phone, a mobile communication device, a pager, a personal digital assistant, a personal information manager, a mobile hand-held computer, a laptop computer, a wireless device, or a wireless modem.

13. A system for programming a one-time programmable memory cell, the system comprising:
    a gate;
    a program circuit coupled to the gate, the program circuit configured to apply a program voltage to the gate;
    a dielectric region vertically below the gate;
    a source terminal vertically below the gate and the dielectric region and horizontally offset to a first side;
    a drain terminal vertically below the gate and the dielectric region and horizontally offset to a second side opposite the first side;
    a drain side Vt program region surrounded by the dielectric region, the drain side Vt program region composed of layers of material, wherein traps are generated in the layers of material during programming of the system in conjunction with the program voltage; and
    a source side Vt program region surrounded by the dielectric region horizontally opposite the drain side Vt program region, the source side Vt program region composed of layers of material, wherein traps are generated in the layers of material during programming of the system in conjunction with the program voltage.

14. The system of claim 13, wherein the gate is a polygate.

15. The system of claim 13, wherein the drain side Vt program region provides a first conductive path between the gate and the drain terminal.

16. The system of claim 15, wherein the source side Vt program region provides a second conductive path between the gate and the source terminal.

17. The system of claim 13, wherein the drain side Vt program region is a charge trap.

18. The system of claim 13, wherein the source side Vt program region is a charge trap.

19. The system of claim 13, wherein the drain side Vt program region and the source side Vt program region are dual program regions of the system, and wherein both the drain side Vt program region and the source side Vt program region are programmed.

20. The system of claim 13, wherein the program circuit is configured to selectively apply the program voltage to the gate to increase a gate threshold voltage approximately 300 millivolts.

21. The system of claim 13, further comprising a first well layer below the source terminal, the drain terminal, and the dielectric region extending horizontally below the source terminal and the drain terminal and extending vertically between the source terminal and the drain terminal to the dielectric region, wherein the program circuit is configured to raise a first well layer voltage to approximately 3 volts.

22. The system of claim 21, wherein the program circuit is configured to raise a source voltage to approximately 3 volts and apply a setup drain voltage of approximately 1 volt.

23. The system of claim 13, wherein the system is integrated into one of a mobile phone, a mobile communication device, a pager, a personal digital assistant, a personal information manager, a mobile hand-held computer, a laptop computer, a wireless device, or a wireless modem.

* * * * *